(12) United States Patent
Van Bokhoven et al.

(10) Patent No.: US 8,405,819 B2
(45) Date of Patent: Mar. 26, 2013

(54) IMMERSION LITHOGRAPHIC APPARATUS AND DEVICE MANUFACTURING METHOD

(75) Inventors: Laurentius Johannes Adrianus Van Bokhoven, Veldhoven (NL); Nicolaas Ten Kate, Almkerk (NL); Raymond Wilhelmus Louis Lafarre, Helmond (NL); Henricus Jozef Castelijns, Bladel (NL); Petrus Martinus Gerardus Johannes Arts, Echt (NL)

(73) Assignee: ASML Netherlands B.V., Veldhoven (NL)

(*) Notice: Subject to any disclaimer, the term of this patent is extended or adjusted under 35 U.S.C. 154(b) by 359 days.

(21) Appl. No.: 12/775,045

(22) Filed: May 6, 2010

(65) Prior Publication Data
US 2010/0283981 A1    Nov. 11, 2010

Related U.S. Application Data

(60) Provisional application No. 61/176,802, filed on May 8, 2009, provisional application No. 61/266,302, filed on Dec. 3, 2009.

(51) Int. Cl.
*G03B 27/32* (2006.01)
*G03B 27/42* (2006.01)
*G03B 27/52* (2006.01)
*G03B 27/58* (2006.01)

(52) U.S. Cl. ............ 355/72; 310/12.06; 355/30; 355/53; 355/77

(58) Field of Classification Search .... 310/12.05–12.06; 355/30, 53, 72, 77
See application file for complete search history.

(56) References Cited

U.S. PATENT DOCUMENTS
4,509,852 A    4/1985    Tabarelli et al.

| | | |
|---|---|---|
| 2004/0136494 A1 | 7/2004 | Lof et al. |
| 2004/0207824 A1 | 10/2004 | Lof et al. |
| 2006/0038968 A1 | 2/2006 | Kemper et al. |
| 2006/0119809 A1 | 6/2006 | Verhagen et al. |
| 2008/0007704 A1 | 1/2008 | Leenders et al. |
| 2008/0073602 A1 | 3/2008 | Jacobs et al. |
| 2009/0168037 A1 | 7/2009 | Kroonen et al. |
| 2010/0060868 A1 | 3/2010 | Tanasa et al. |

FOREIGN PATENT DOCUMENTS

| | | |
|---|---|---|
| EP | 1 420 300 A2 | 5/2004 |
| JP | 7-130635 | 5/1995 |
| JP | 8-285520 | 11/1996 |
| JP | 11-097339 | 4/1999 |
| JP | 2006-523027 | 10/2006 |
| JP | 2006-332146 | 12/2006 |
| JP | 2009-141356 | 6/2009 |
| WO | 99/49504 A1 | 9/1999 |
| WO | 2005/064405 A2 | 7/2005 |
| WO | 2005/083758 | 9/2005 |

OTHER PUBLICATIONS

Japanese Office Action mailed Jan. 31, 2012 in corresponding Japanese Patent Application No. 2010-104684.
U.S. Appl. No. 61/193,576, filed Dec. 8, 2008, Knaapen et al.
Japanese Office Action mailed Jan. 23, 2013 in corresponding Japanese Patent Application No. 2010-104684.

*Primary Examiner* — Toan Ton
*Assistant Examiner* — Colin Kreutzer
(74) *Attorney, Agent, or Firm* — Pillsbury Winthrop Shaw Pittman LLP

(57) ABSTRACT

In an all-wet immersion lithographic apparatus, the immersion liquid is allowed to flow off an edge of the substrate table. The immersion liquid is moved with the substrate table during exposure. The motion of the immersion liquid may result in a disturbance and/or de-wetting. A geometry of the substrate table is proposed that may reduce such a disturbance and/or de-wetting. The cross-sectional edge profile of the substrate table and/or the plan shape of the substrate table are considered.

22 Claims, 8 Drawing Sheets

- PRIOR ART -

IMMERSION LITHOGRAPHIC APPARATUS AND DEVICE MANUFACTURING METHOD

This application claims priority and benefit under 35 U.S.C. §119(e) to U.S. Provisional Patent Application Ser. No. 61/176,802, entitled "Immersion Lithographic Apparatus and Device Manufacturing Method", filed on May 8, 2009, and to U.S. Provisional Patent Application Ser. No. 61/266,302, entitled "Immersion Lithographic Apparatus and Device Manufacturing Method", filed on Dec. 3, 2009. The contents of those applications are incorporated herein in their entirety by reference.

FIELD

The present invention relates an immersion lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also or alternatively possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may be regarded as increasing the effective numerical aperture (NA) of the system and/or increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

In one arrangement a liquid supply system provides liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in-and out-lets positioned around the final element are possible; one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets IN. The inlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). The arrows above the substrate W in the inlet/outlet illustrate the direction of liquid flow, and the arrow below the substrate W illustrates the direction of movement of the substrate table.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table. In yet another arrangement there are two tables, one of which is for supporting a substrate; the other table is for keeping immersion liquid in contact with a projection system during substrate swap.

PCT patent application publication no. WO 2005/064405 discloses an all wet arrangement in which the immersion liquid is unconfined. In such a system substantially the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table may prevent the liquid from escaping so that it can be removed from the top surface of the substrate table in a controlled way. Although such a system may improve temperature control and processing of the substrate, evaporation of the immersion liquid may still occur. One way of helping to alleviate that problem is described in United States patent application publication no. US 2006/119809. A member is provided which covers the substrate W in all positions and which is arranged to have immersion liquid extending between it and the top surface of the substrate and/or substrate table which holds the substrate.

SUMMARY

During exposure, different parts of a substrate may be exposed by moving the substrate and substrate table relative to the projection system. In an all wet arrangement, immersion fluid provided on the upper surface of the substrate and substrate table may be moved with the substrate and substrate table. As such, the immersion fluid has to be accelerated by the substrate table.

Controlling the motion of the immersion fluid is important. If the immersion fluid (such as immersion liquid) is moved (for example accelerated and/or removed) in an uncontrolled manner, it may, for example, splash, form droplets, and/or form waves. This may result in damage to a component and/or lead to an inaccuracy in exposure of the substrate.

It is desirable, for example, to provide an apparatus by which immersion fluid can be moved in a controlled manner.

According to an aspect, there is provided a substrate table for an immersion lithographic apparatus having a projection system for projecting a patterned beam of radiation onto a substrate, the projection system having an optical axis, wherein:

the substrate table is configured to support a substrate during exposure and to have an immersion liquid flow off the substrate and over an edge region of the substrate table extending from a substantially flat portion that is perpendicular to the optical axis of the projection system, the edge region having:

a first edge profile in a cross-section taken in a first plane passing through the geometric centre of the substrate table and perpendicular to a first direction in the plane of the substrate, the first edge profile comprising a curve;

a second edge profile, different to the first edge profile, in a cross-section taken in a second plane passing through the geometric centre of the substrate table and perpendicular to a second direction in the plane of the substrate and parallel to the first direction, the second edge profile comprising a curve, wherein:

the first edge profile is longer than the second edge profile.

According to an aspect, there is provided a substrate table for an immersion lithographic apparatus, the substrate table configured to support a substrate during exposure and to have an immersion liquid flow off the substrate and over an edge region of the substrate table, wherein, in plan view, the perimeter of the substrate table has no discontinuities in radius of curvature.

According to an aspect, there is provided a substrate table for an immersion lithographic apparatus, the substrate table comprising:

a substrate support configured to support a substrate, a perimeter of the substrate table being defined in a plane parallel to a surface of the substrate support;

an edge region around at least a part of the perimeter of the table; and a substantially planar portion between the substrate support and the edge region, the edge region having an edge profile in a plane perpendicular to the planar portion and/or substrate support, wherein:

the edge profile continuously changes along the part of the perimeter of the table, the edge profile being configured so that immersion liquid supplied to the substrate and/or substrate table flows smoothly off the substrate table from the substantially planar portion over the edge region.

According to an aspect, there is provided a device manufacturing method comprising:

supplying an immersion liquid to a substrate table and/or a substrate held by a substrate table, wherein the substrate table has an edge region that extends from a substantially flat portion that is parallel to the plane of the substrate during exposure, the edge region having:

a first edge profile in a cross-section taken in a first plane passing through the geometric center of the substrate table and perpendicular to a first direction in the plane of the substrate, the first edge profile comprising a curve, and a second edge profile, different to the first edge profile, in a cross-section taken in a second plane passing through the geometric centre of the substrate table and perpendicular to a second direction in the plane of the substrate and parallel to the first direction, the second edge profile comprising a curve, wherein the first edge profile is longer than the second edge profile;

allowing the immersion liquid to flow off the substrate and over the edge region of the substrate table; and projecting a patterned beam of radiation through the immersion liquid onto the substrate so as to expose a target portion of the substrate.

According to an aspect, there is provided a device manufacturing method comprising:

supplying an immersion liquid to a substrate table and/or a substrate held by a substrate table, wherein the substrate table has a perimeter that, in plan view, has no discontinuities in radius of curvature;

allowing the immersion liquid to flow off the substrate and over the edge region of the substrate table; and projecting a patterned beam of radiation through the immersion liquid onto the substrate so as to expose a target portion of the substrate.

According to an aspect, there is provided a device manufacturing method comprising:

supplying an immersion liquid to a substrate table and/or a substrate held by a substrate table, wherein the substrate table has:

a substrate support configured to support a substrate, a perimeter of the substrate table being defined in a plane parallel to a surface of the substrate support;

an edge region around at least a part of the perimeter of the table; and a substantially planar portion between the substrate support and the edge region, the edge region having an edge profile in a plane perpendicular to the planar portion and/or substrate support, wherein the edge profile continuously changes along the part of the perimeter of the table, the edge profile configured so that immersion liquid supplied to the substrate and/or substrate table flows smoothly off the substrate table from the substantially planar portion over the edge region;

allowing the immersion liquid to flow off the substrate and over the edge region of the substrate table; and projecting a patterned beam of radiation through the immersion liquid onto the substrate so as to expose a target portion of the substrate.

According to an aspect, there is provided a method of removing immersion liquid from a layer of immersion liquid formed on a surface of an immersion lithographic apparatus, the method comprising:

actively removing immersion liquid from a localized area of the surface so as to produce a dry region that has an interface with the layer of immersion liquid; and allowing the interface to propagate through the layer of immersion liquid such the area of the dry region increases, and the area of the layer of immersion liquid reduces.

According to an aspect, there is provided a liquid removal apparatus configured to remove liquid from a layer of immersion liquid formed on a surface an immersion lithographic apparatus, the liquid removal apparatus comprising a trigger device configured to remove immersion liquid from a localized area of the surface so as to produce a dry region that has an interface with the layer of immersion liquid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
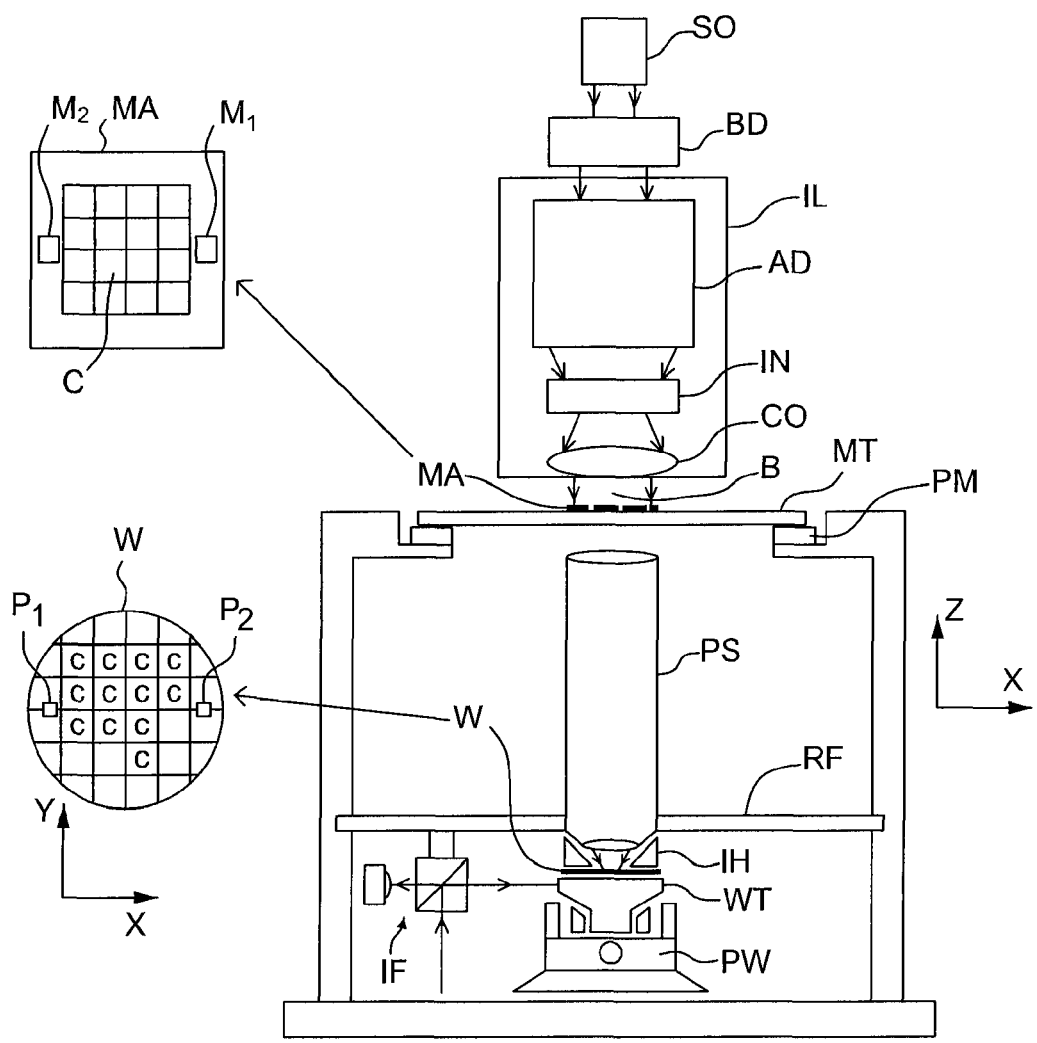
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may be employed.

Arrangements for providing liquid between a final element of the projection system and the substrate can be classed into at least two general categories. These are the bath type arrangement and the localized immersion system. In the bath type arrangement substantially the whole of the substrate and optionally part of the substrate table is submersed in a bath of liquid. In the so called localized immersion system a liquid supply system is used in which liquid is only provided to a localized area of the substrate. In the localized immersion system, the space filled by liquid is smaller in plan than the top surface of the substrate. The liquid in the space, desirably the liquid in the space which is in contact with the substrate, remains substantially stationary relative to the projection system while the substrate moves underneath the space. The region filled with immersion liquid may be referred to as a localized liquid region.

A further arrangement, to which an embodiment of the present invention is directed, is the all wet immersion system. In an all wet immersion system the liquid is unconfined. In this arrangement substantially the whole top surface of the substrate and all or part of the substrate table is covered in immersion liquid. The depth of the liquid covering at least the substrate is small. The liquid may be a layer or film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area.

Figure 5:
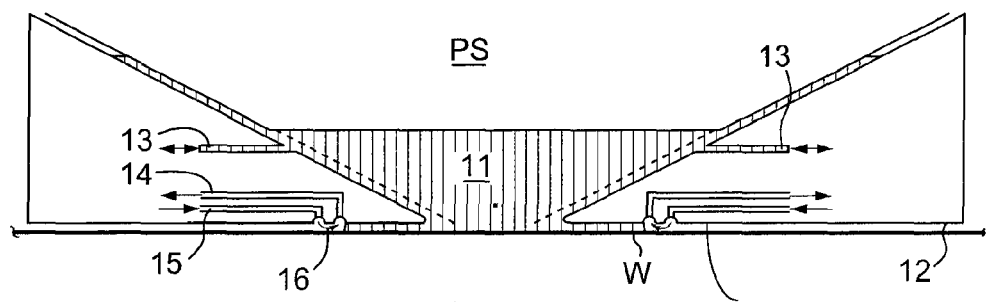
FIG. 5 depicts a liquid confinement structure for use in a lithographic projection apparatus.

Four different types of localized liquid supply systems are illustrated in FIGS. 2-5. The liquid supply systems disclosed in FIGS. 2-4 were described above. Another arrangement which has been proposed is to provide the liquid supply system with a fluid confinement structure. The fluid confinement structure may extend along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). A seal may be formed between the fluid confinement structure and the surface of the substrate. In an embodiment, the seal is a contactless seal such as a gas seal.

FIG. 5 schematically depicts a localized liquid supply system or fluid handling structure or device with a body 12 forming a barrier member or liquid confinement structure, which extends along at least a part of a boundary of the space 11 between the final element of the projection system PS and a surface defined by the substrate table WT, substrate W or both. (Please note that reference in the following text to surface of the substrate W also refers in addition or in the alternative to a surface of the substrate table WT, unless expressly stated otherwise).

The fluid handling device at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The gas seal 16 may be formed by gas, e.g. air or synthetic air but, in an embodiment, $N_2$ or another inert gas. The gas in the gas seal 16 is provided under pressure via inlet opening 15 to the gap between body 12 and substrate W. The gas is extracted via outlet 14. Such a system is disclosed in United States patent application publication no. US 2004-0207824. The space 11 is at least partly formed by the body 12 positioned below and surrounding the final element of the projection system PS. Liquid is brought into the space 11 below the projection system PS and within the body 12 by liquid inlet opening 13. The liquid may be removed by liquid outlet opening 13. In the cross-sectional view of FIG. 5, arrows illustrate the direction of fluid flow in and out of openings in the fluid confinement structure.

The example of FIG. 5 is a so called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in United States patent application publication no US 2006-0038968. However, an embodiment of the invention is concerned with an all wet immersion lithographic apparatus in which the immersion liquid is unconfined.

Figure 2:
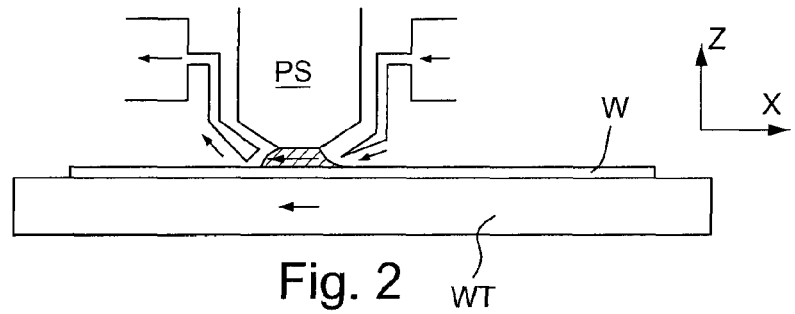
FIGS. 2 and 3 depict a liquid supply system for use in a lithographic projection apparatus.
Figure 3:
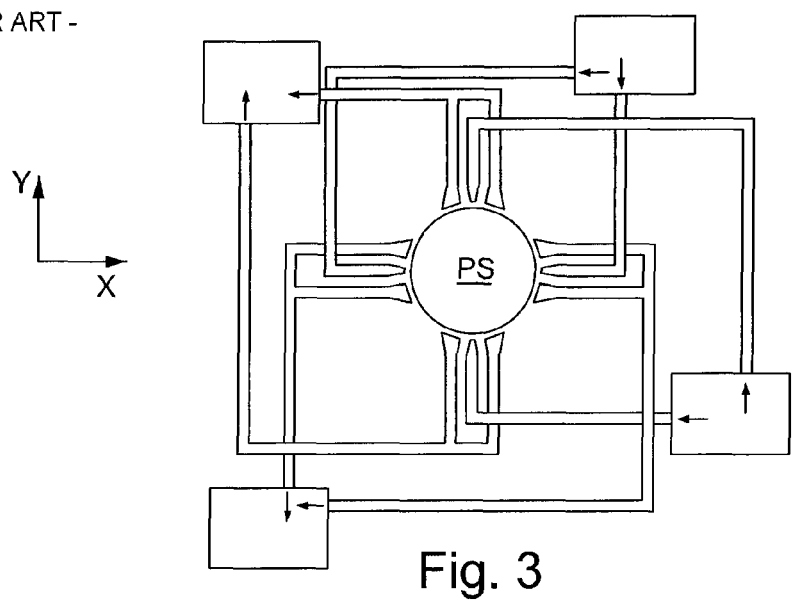
Figure 4:
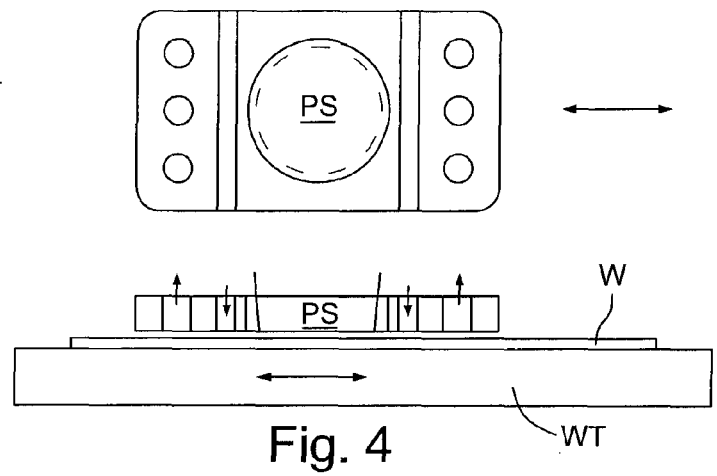
FIG. 4 depicts a liquid supply system for use in a lithographic projection apparatus.

Many types of fluid handling structure are arranged to allow a flow of fluid across the space 11 between the final element of the projection system PS and the substrate W in a certain direction. For example, in a fluid handling system the flow may be achieved by a plurality of openings (e.g. inlets and outlets) which may be defined in a surface that surrounds the space 11. The flow may be adjusted by selectively supplying and/or extracting liquid through the openings to create the desired flow. The flow rate may be altered by varying the flow rate through one or more openings. Thus in an embodiment similar to that shown in FIG. 5, the liquid opening 13 may comprise a plurality of openings for the through flow of liquid in the space 11 confined by the body 12. The openings are defined in a surface which may surround the space 11. Liquid can be supplied or removed through the openings to provide a flow in the desired direction, for example across the space 11. The openings through which liquid is supplied to the space may be referred to as a set of supply openings. The openings through which liquid may be removed may be referred to as a set of removal openings. In an embodiment, an all wet system is used, and so there may be no removal openings. As shown in the embodiment of FIGS. 2 and 3, each set of openings may be considered to be a plurality of bodies each of which has a surface in which is defined an opening for the flow of liquid therethrough.

A difficulty with any of the localized area liquid supply systems is that it is difficult to contain all of the immersion liquid and to avoid leaving some behind on the substrate as the substrate moves under the projection system. In order to avoid liquid loss in such localized area liquid supply systems, the speed at which the substrate moves under the liquid supply system must be limited. This is particularly so with an immersion liquid capable of generating a high value of NA in the immersion lithography apparatus, especially a liquid other than water. Such a liquid tends to have a lower surface tension than water as well as a higher viscosity. Breakdown speed of a meniscus scales with surface tension over viscosity so that a high NA liquid may be far harder to contain. Leaving liquid behind on the substrate in only certain areas may lead to temperature variations throughout the substrate due to evaporation of the immersion liquid left behind on only certain areas of the substrate and thus leading to overlay errors. Also or alternatively, as the immersion liquid evaporates, it is possible that drying stains (from contamination or particles) can be left behind on the substrate W after evaporation. Also or alternatively, the liquid may diffuse into the resist on the substrate leading to inconsistencies in the photochemistry of the top surface of the substrate. These problems may exist when, for example, either water or a high NA liquid is used as the immersion fluid. A bath type solution (i.e. where the substrate is submerged in a container of liquid) would alleviate many of these problems. However as explained herein, one or more problems remain with conventional bath type solutions (for example, substrate swap in the immersion apparatus is particularly difficult with a bath type solution, and/or retaining sufficient control of the unconfined immersion liquid layer can be difficult). An embodiment of the present invention addresses one or more of these issues, and/or one or more other issues not presented herein.

An embodiment of the invention may be applied to a fluid handling structure used in all wet immersion apparatus. In the all wet embodiment, fluid is allowed to partially or completely cover the top surface of the substrate table, for example, by allowing liquid to leak out of a confinement structure which confines liquid to between the final element of projection system and the substrate. An example of a fluid handling structure for an all wet embodiment can be found in United States patent application publication no. US 2010/0060868, which is hereby incorporated by reference.

Figure 6:
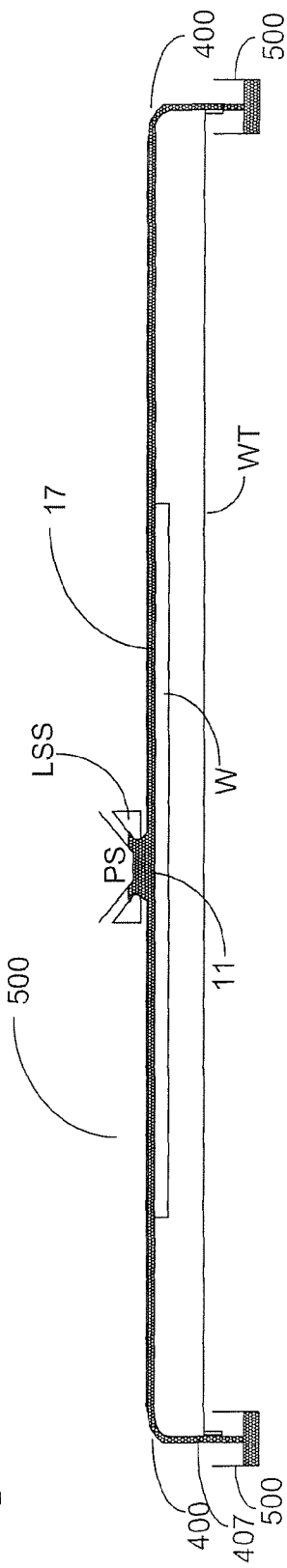
FIG. 6 depicts, in cross section, a liquid supply system and a liquid removal system in accordance with an embodiment of the invention.

In an embodiment as shown in FIG. 6, a localized liquid supply system LSS is used to provide liquid below the projection system PS above the substrate W. A flow of liquid in that area is generated. For this purpose any localized liquid supply system may be used, e.g. any one of the types shown in FIGS. 2-5, such as that illustrated in FIG. 5 or a variant thereof. However, the seal formed between the localized liquid supply system LSS and the substrate W does not need to be made to be particularly well and may in fact be entirely missing. That is, the liquid is unconfined. For example, all of the components on the bottom side of the barrier member 12 may be missing from the FIG. 5 embodiment. The design is chosen such that a film or layer of liquid 17 covers substantially the whole of the top surface of the substrate W as is illustrated in FIG. 6. The top surface of the substrate table WT may be fully or partially covered in the layer of liquid 17. U.S. patent application publication no. US 2008/0073602 discloses several other embodiments which allow the whole of the top surface of the substrate W to be covered in a film of liquid 17. It will be understood that the present invention can be applied to all of the liquid supply systems disclosed in U.S. patent application publication no. US 2008/0073602.

Figure 7:
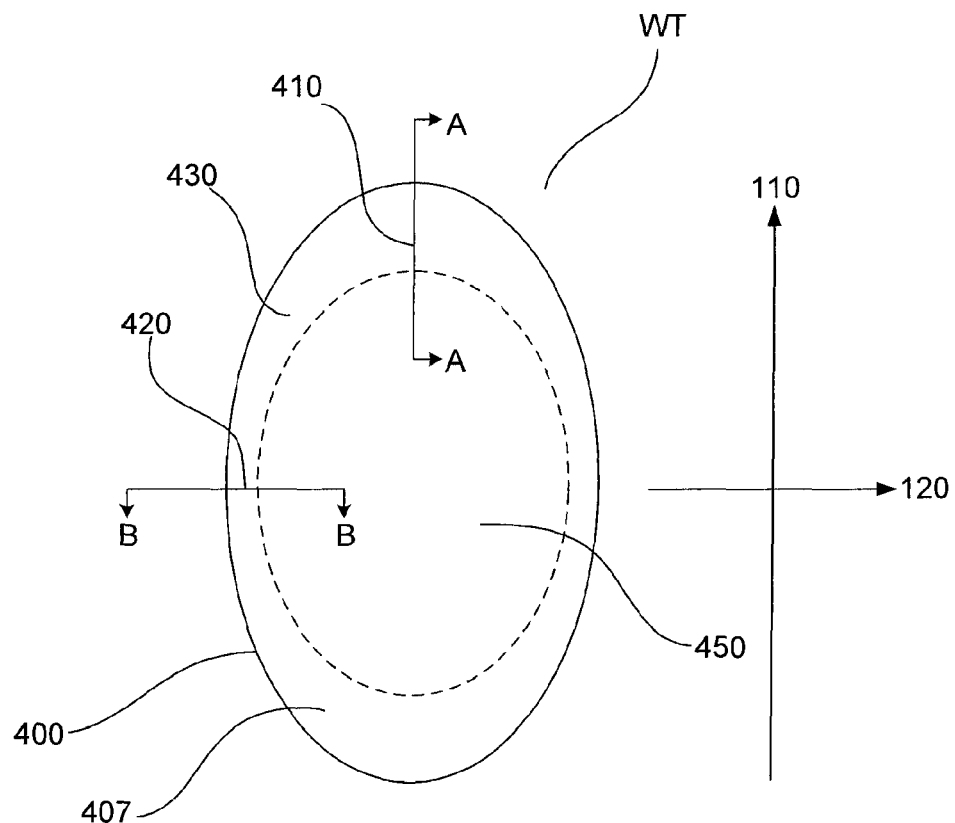
FIG. 7 depicts, in plan view, a substrate table according to an embodiment of the invention.

According to an embodiment, immersion liquid may drain off an edge 400 of the substrate table WT, as shown in FIG. 6. The substrate table WT has an edge face 407, as shown in FIG. 7. The edge face 407 is an edge surface that is connected to the flat top surface 450 of the substrate table WT (see, e.g., FIG. 8). The substrate W is held, and/or supported, on the flat top surface 450.

FIG. 6 shows a general arrangement of an embodiment in a cross section taken through the substrate table WT. The cross section may be taken in, for example, either the scanning direction or the stepping direction. The detail of, for example, the shape of the edge face 407 may be dependent on the plane through which the cross section is taken. This is discussed below. As can be seen in FIG. 6, immersion liquid is allowed to flow off the edge 400. The liquid drains off the edge 400 and falls into a gutter 500 positioned under the edge 400. In an embodiment, liquid is allowed to drain off the entire extent of the edge 400.

As can be seen in FIG. 6, immersion liquid is provided to an area between the projection system PS and the substrate W. Liquid is allowed to leak under the liquid supply system LSS over the whole of the top surface of the substrate W. Furthermore, the immersion liquid may flow or leak onto the top surface of the substrate table WT. Thereafter the liquid may flow or leak over the edge 400 over at least a part of the edge face 407 and into the gutter 500. The liquid is removed from the gutter 500 thereafter.

In the embodiment shown in FIG. 6, a liquid layer 17 is formed on the upper surface of the substrate W and substrate table WT. This liquid layer 17 moves with the substrate W and substrate table WT during exposure. This requires the liquid layer 17 to be moved, and accelerated. Typically, it is desirable to provide the immersion liquid, via the liquid supply system LSS, to form the liquid layer 17 at a high flow rate. This is advantageous because it reduces the heat transfer to and/or from the liquid layer 17. Furthermore, rapid movement (including rapid acceleration) of the substrate table WT and substrate W is desirable in order to increase throughput of substrates. This rapid motion of the substrate W and substrate table WT necessitates rapid movement (including rapid acceleration/deceleration) of the liquid layer 17, including at the edge 400 of the substrate table WT and where the liquid layer 17 flows over the edge face 407.

The high flow rate in the liquid layer 17 and/or the rapid motion of the substrate W and substrate table WT mean that it is difficult to remove the immersion liquid over the edge face 407 in a controlled manner. In particular, liquid droplets may become removed from the liquid layer 17. These liquid droplets may splash or fall onto, possibly vital, components of the immersion lithographic apparatus. For example, the droplets may fall onto a positioning (or metrology) system and/or sensor. This may result in those components ceasing to work, or failing to operate in the intended manner. For example, the droplets may evaporate, causing a thermal load. Additionally or alternatively, the droplets may have adverse mechanical and/or optical effects on the immersion lithographic apparatus. Additionally or alternatively, fine immersion liquid droplets (or mist droplets) may form, which may produce a mist. Such mist droplets may increase the humidity of the environment. The mist droplets may result in droplets forming in any location of the immersion lithographic apparatus that is in fluid communication with the liquid layer 17.

Additionally or alternatively, if the flow if liquid over the edge face 407 is not sufficiently controlled, a disturbance, such as waves, may be formed in the liquid layer 17. Such a disturbance can alter an optical property of the liquid layer 17, for example in the region through which the exposing radiation beam passes. The disturbance may have an adverse effect on the exposure of the substrate, for example on the repeatability and/or accuracy of the exposure.

The geometry of the substrate table WT can have an impact on the flow of immersion liquid. A more stable liquid flow may result from a certain shape of the substrate table WT in plan view and/or certain shape of the edge face 407 in cross section, and/or a combination thereof. This may result in a more stable liquid layer 17.

FIG. 7 shows a substrate table WT according to an embodiment in plan view. The substrate table WT has a perimeter edge 400. The edge face 407 of the substrate table WT is denoted by the area between the inner dotted line and the outer solid line 400. In FIG. 7, the two arrows 110, 120 next to the substrate table WT indicate scanning 110, and stepping 120 directions respectively.

In an embodiment, the substrate table WT is longer in the scanning direction 110 than in the stepping direction 120. This is because the motion, for example the acceleration, of the substrate table WT may be greater in the scanning direction 110 than in the stepping direction 120. This means that a greater instability and/or disturbance in the immersion liquid layer 17 may be generated by the motion in the scanning direction 110 than the motion in the stepping direction 120. Thus, elongating the substrate table WT in the scanning direction 110 may help to reduce the propagation and/or formation of any disturbance (such as waves) in the liquid layer 17 in the scanning direction 110. For example, the elongation in the scanning direction 110 may help to prevent any disturbance that is formed in the liquid layer 17 from propagating to the immersion liquid in the area 11 through which the exposing radiation beam passes.

In an embodiment, such as that shown in FIG. 7, the radius of curvature of the edge 400 (which may also be referred to herein as the perimeter 400) of the substrate table WT is continuous. As such, there are no discontinuities in the radius of the curvature of the edge 400 of the substrate table WT in plan view. It will be understood that references to the edge 400 of the substrate table WT having no discontinuities includes the possibility of the edge 400 of the substrate table WT having substantially no discontinuities. Thus, reference to the edge 400 having no discontinuities in radius of curvature includes the possibility of the edge 400 having small and/or insignificant discontinuities in radius of curvature. This may mean that there are no sharp corners on the edge 400 of the substrate table WT. However, this does not mean that the radius of curvature is necessarily constant around the entire edge 400 (although in an embodiment this may be the case). For example, in the embodiment shown in FIG. 7, the radius of curvature of the edge 400 is constantly changing, but has no discontinuities. In an embodiment, the shape of the edge 400 of the substrate table WT in plan view may be oval and/or elliptical.

The substrate table WT may be any suitable size. For example the length of the substrate table WT in the scanning direction 110 may be selected from the range of 400 mm to 700 mm. In an embodiment, the length of the substrate table WT in the scanning direction 110 may be selected from the range of 500 mm to 600 mm. In an embodiment, the length of the substrate table WT in the scanning direction 110 may be about 526 mm. The width of the substrate table WT in the stepping direction 120 may be selected from the range of 300 mm to 500 mm. In an embodiment, the width of the substrate table WT in the stepping direction 120 may be selected from the range of 350 mm to 450 mm. In an embodiment, the width of the substrate table WT in the stepping direction 120 may be about 398 mm. The depth of the substrate table WT in the direction perpendicular to the plane of the scanning 110 and stepping 120 directions may be selected from the range of 5 mm to 25 mm. In an embodiment, the depth of the substrate table WT in the direction perpendicular to the plane of the scanning 110 and stepping 120 directions may be selected from the range of 10 mm to 20 mm. In an embodiment, the depth of the substrate table WT in the direction perpendicular to the plane of the scanning 110 and stepping 120 directions may be about 16 mm.

The lack of discontinuities in the edge 400 in the substrate table WT results in a reduction in or elimination of a disturbance (for example, instabilities and/or waves) being formed over the edge face 407 and/or being propagated to the immersion liquid layer 17, for example in the area shown between the edge 400 and the dashed line in FIG. 7. Having discontinuities (for example substantial discontinuities) in the profile of the edge 400 of the substrate table WT, for example in the form of corners and/or sharp bends, may result in a disturbance being generated in the immersion liquid as it flows over the edge face 407 of the substrate table WT.

In an embodiment, the minimum radius of curvature of any point on the edge 400 of the substrate table WT in plan view may be above a particular value. Setting a lower limit on the minimum radius of curvature of any point of the edge 400 of the substrate table WT may reduce the disturbance and/or instability produced and/or propagated in the immersion liquid as it flows over the edge face 407. This means that the maximum velocity and/or acceleration of the substrate table WT can be increased.

In an embodiment, the minimum radius of curvature of any point on the edge 400 of the substrate table WT is approximately 10 mm. With such a minimum radius of curvature, the velocity of the substrate table WT that can be used during exposure without an unacceptable level of disturbance force forming and/or de-wetting of the substrate table WT occurring may be approximately 0.8 m/s.

In an embodiment, the minimum radius of curvature of any point on the edge 400 of the substrate table WT is approximately 30 mm. With such a minimum radius of curvature, the velocity of the substrate table WT that can be used during exposure without an unacceptable level of disturbance force forming and/or de-wetting of the substrate table WT occurring may be approximately 1.1 m/s.

In an embodiment, the minimum radius of curvature of any point on the edge 400 of the substrate table WT is approximately 80 mm. With such a minimum radius of curvature, the velocity of the substrate table WT that can be used during exposure without an unacceptable level of disturbance force forming and/or de-wetting of the substrate table WT occurring may be approximately 1.6 m/s.

In an embodiment, the immersion lithographic apparatus comprises a fluid handling structure which is arranged to supply the immersion liquid which forms the immersion liquid layer 17 over the substrate W and substrate table WT. For example, the fluid handling structure may comprise the liquid supply structure LSS shown in FIG. 6. The fluid handling structure may have a lower surface. This lower surface of the fluid handling structure may be referred to as a facing surface or lower facing surface because it faces the substrate W and/or substrate table WT.

The outer edge (or perimeter) of the lower facing surface of the fluid handling structure may be located substantially above the outer edge 400 of the substrate table WT in plan view. Thus, at each angular position about an optical axis of the projection system PS, the edge 400 of the substrate table WT may correspond to an equivalent position on the outer edge of the fluid handling structure. In an embodiment, the instantaneous radius of curvature of the edge 400 of the substrate table WT in plan view may be greater than the instantaneous radius of curvature of the point on the perimeter of the lower facing surface of the fluid handling structure that is at the equivalent angular position. In other words, the instantaneous radius of curvature of the edge 400 may be greater than the instantaneous radius of curvature of the perimeter of the fluid handling structure located directly above, or opposite to it. Such an arrangement may further help to reduce the formation of any disturbance, such as waves, in the immersion liquid layer 17. Alternatively or additionally, this arrangement may further help to dampen (i.e. reduce the propagation of) any disturbance that is formed.

In an embodiment, such as that shown in FIG. 7 and discussed above, the radius of curvature of the edge 400 of the substrate table WT in plan view may change continuously with angular position. For example, the edge 400 may form an elliptical shape, in particular an oval shape. This may further help to reduce the formation and/or propagation of a disturbance in the immersion liquid. Additionally or alternatively, the continuously varying radius of curvature may help to promote more homogeneous wetting (and/or to reduce re-wetting) of the substrate table, for example, of the edge face 407. This may help to reduce droplets of immersion liquid detaching from the immersion liquid layer 17, for example as it flows over the edge face 407. In such an embodiment, such as that shown in FIG. 7, it is thought that during motion of the substrate table WT in either the scanning direction 110 or the stepping direction 120, the curved edge 400 in plan view helps to pull the liquid along with the substrate table WT in its direction of motion. This may help, for example, to reduce the de-wetting of the substrate table WT.

Figure 10:
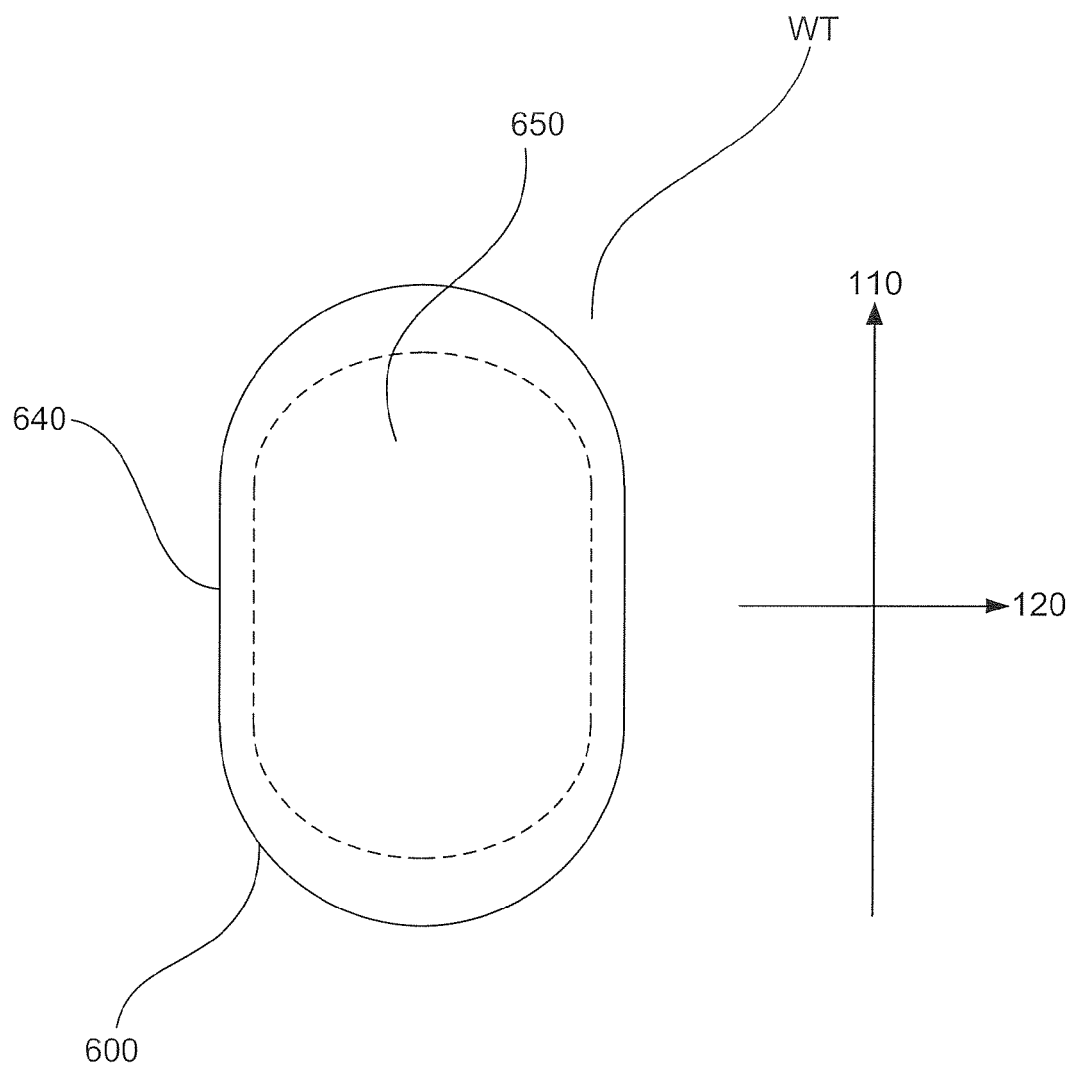
FIG. 10 depicts, in plan, an alternative shape of substrate table according to an embodiment of the invention.

However, in an embodiment, it is not essential that the radius of curvature of the edge 400 varies continuously with angular position about the optical axis of the projection system PS. For example, as shown in FIG. 10, a substrate table WT according to an embodiment may have straight portions 640. In an embodiment, these straight portions 640 may be aligned with the scanning direction 110. An advantage of aligning any straight portions with the scanning direction 110 may be that higher magnitude and/or more frequent accelerations may be provided during scanning than during stepping. Thus the acceleration of the liquid in the scanning direction 110 may be of a higher magnitude and/or more frequent than the acceleration of the liquid in the stepping direction 120. As such, a problem associated with scattering of immersion liquid (such as droplet formation) may conventionally be less significant in the stepping direction 120 than in the scanning direction 110. In the embodiment shown in FIG. 10, the radius of curvature of the edge 600 of the substrate table WT does not vary continuously with angular position. For example, the radius of curvature does not vary along the straight portions 640 of the edge 600. The edge 600 of the substrate table WT in the embodiment shown in FIG. 10 still has substantially no discontinuities in the radius of curvature. The substrate table WT may have a flat top surface 650.

The plan view shapes of the substrate table WT shown in FIGS. 7 and 10 are symmetrical about the scanning 110 and stepping 120 directions. However, this need not be the case. In some embodiments, the plan view shape of the substrate table WT may be asymmetric about the scanning axis 110 and/or the stepping axis 120. This may further help to diffuse and/or reduce the propagation and/or formation of any disturbance in the immersion liquid.

Figure 8A:
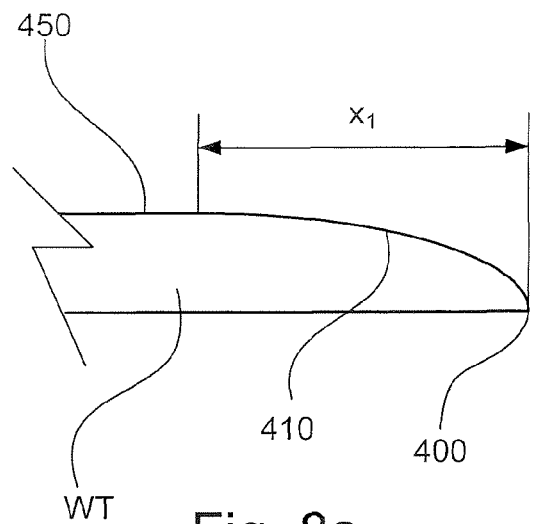
FIGS. 8a and 8b illustrate, in cross section, and in detail, edge portions of the substrate table over which, in use, liquid may flow.

FIG. 8a shows a cross section through the substrate table WT in the plane shown as A-A in FIG. 7. In other words, FIG. 8a shows the edge profile that extends at least through the edge face 407 of the substrate table WT in a cross section taken in a plane passing through the geometric center of the substrate table WT and perpendicular to the stepping direction 120. The plane A-A through which the cross section shown in FIG. 8a is taken is parallel to the scanning direction 110. The plane A-A is parallel to the scanning direction 110 and to the optical axis of the projection system PS.

As shown in FIG. 8a, the edge profile 410 of the edge face 407 in a cross section through the plane A-A may extend continuously from the flat portion 450 of the substrate table WT. The Out portion 450 of the substrate table WT is substantially perpendicular to the optical axis of the projection system. The substrate W (not shown in FIG. 7 but located within the dashed line) is held, or supported, on the flat portion 450 of the substrate table WT. For example, the substrate table WT may hold, or support, the substrate W in an indented position, such as that shown in cross section in FIG. 6. The upper surface of the substrate W (i.e. the surface being exposed) may be coplanar with a surface (for example with the Out portion 450) of the substrate table WT.

The edge profile 410 shown in FIG. 8a extends over a distance $X_1$ in a direction perpendicular to the edge 400 of the substrate table WT. In other words, the edge profile shown in FIG. 8a extends over a distance $X_1$ in the scanning direction 110. In an embodiment, $X_1$ is selected from the range of 10 mm to 70 mm In an embodiment, $X_1$ is selected from the range of 20 mm to 60 mm. In an embodiment. $X_1$ is selected from the range of 30 mm to 50 mm. In an embodiment, the distance $X_1$ over which the edge profile 410 in the scanning direction 110 extends is approximately 40 mm.

Figure 9A:
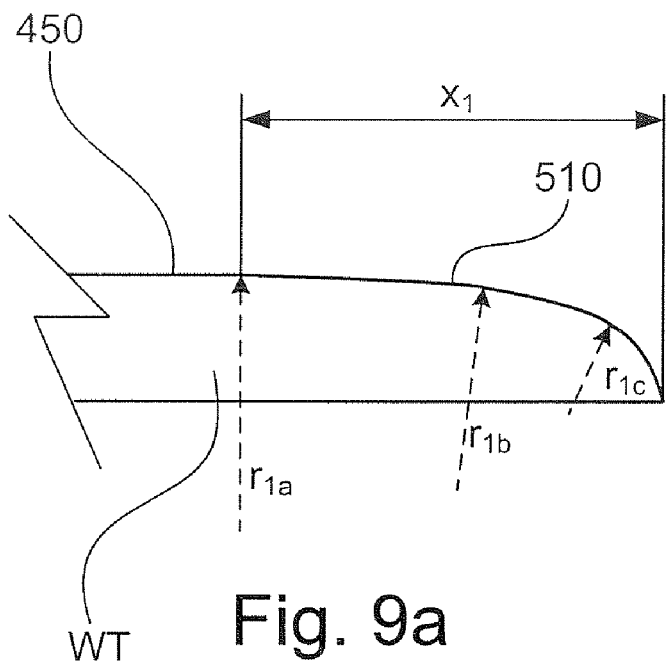
FIGS. 9a and 9b depict, in cross section, and in detail, alternative edge portions of a substrate table over which, in use, liquid may flow.

In an embodiment, the edge profile 410 in the scanning direction is a smooth curve, i.e. there are no discontinuities in radius of curvature. However, this is not essential. FIG. 9a shows an edge profile 510 taken through the plane A-A in an alternative embodiment. The edge profile 510 shown in FIG. 9a comprises three discrete sections, or segments, each with a different radius of curvature. Although the embodiment shown in FIG. 9a has three different sections each with a different radius of curvature, alternative embodiments may have a different number of sections, for example two sections, four sections, five sections, six sections, seven sections, or more than seven sections.

In the edge profile 510 shown in FIG. 9a, the radius $r_{1a}$ may be selected from the range of 10 mm-40 mm, for example approximately 25 mm. The radius $r_{1b}$ may be selected from the range of 5 mm-15 mm, for example approximately 10 mm. The radius $r_{1c}$ may be selected from the range of 2 mm-10 mm, for example approximately 5 mm. In an embodiment, $r_{1a} > r_{1b} > r_{1c}$, although this is not essential. In an embodiment, at least a part of the edge profile 510 (or 410) may not be curved, i.e. it may have an infinite radius of curvature.

The edge profile 510 of the embodiment shown in FIG. 9a extends over a distance labeled $X_1$. The range of values that may be represented by the value $X_1$ shown in FIG. 9a may be the same as the range of values for $X_1$ outlined above in relation to the edge profile 410 shown in FIG. 8a.

Figure 8B:
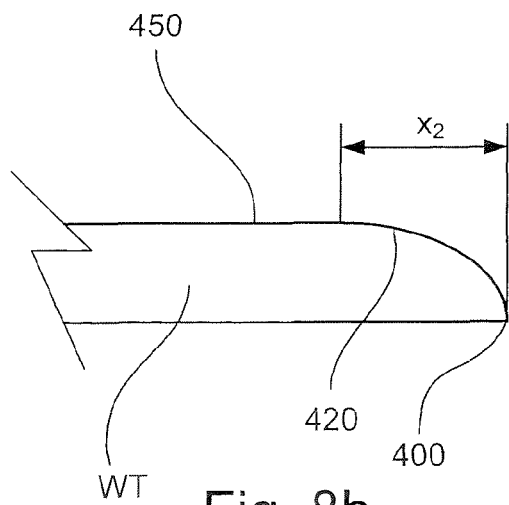

FIG. 8b shows a cross section through the substrate table WT in the plane shown as B-B in FIG. 7. In other words, FIG. 8b shows the edge profile that extends at least through the edge face 407 of the substrate table WT in across section taken in a plane passing through the geometric center of the substrate table WT and perpendicular to the scanning direction 110. The plane B-B through which the cross section shown in FIG. 8b is taken is parallel to the stepping direction 120. The plane B-B is parallel to the stepping direction 120 and to the optical axis of the projection system PS.

As shown in FIG. 8b, the edge profile 420 of the edge face 407 in a cross section through the plane B-B extends continuously from the flat portion 450 of the substrate table WT.

The edge profile 420 shown in FIG. 8b extends over a distance $X_2$ in a direction perpendicular to the edge 400 of the substrate table WT. In other words, the edge profile shown in FIG. 8b extends over a distance $X_2$ in the stepping direction 120. As shown in FIG. 7, the stepping direction 120 is perpendicular to the scanning direction in which the edge profile 410 shown in FIG. 8a is provided. In an embodiment, $X_2$ is selected from the range of 5 mm to 15 mm. In an embodiment, the distance $X_2$ over which the edge profile 420 in the stepping direction 120 extends is approximately 10 mm.

Figure 9B:
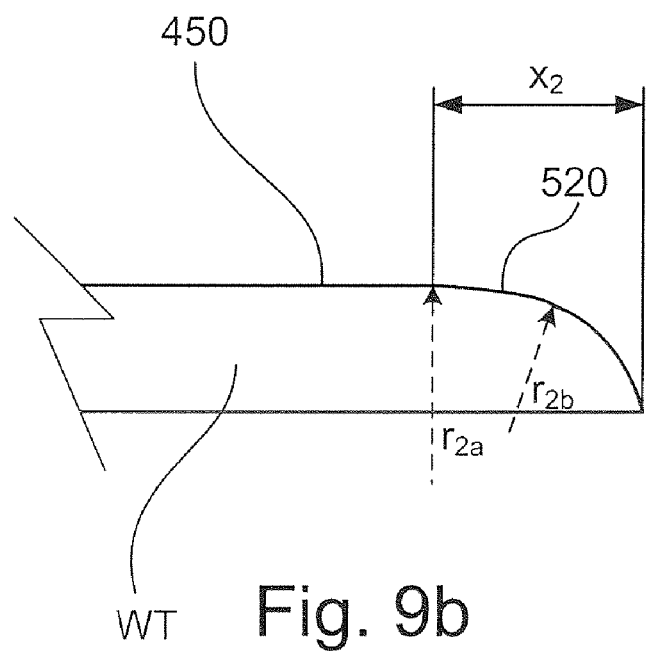

In an embodiment, the edge profile 420 in the stepping direction is a smooth curve, i.e. there are no discontinuities in radius of curvature. However, this is not essential. FIG. 9*b* shows an edge profile 520 taken through the plane B-B in an alternative embodiment. The edge profile 520 shown in FIG. 9*b* comprises two discrete sections, or segments, each with a different radius of curvature. Although the embodiment shown in FIG. 9*b* has two different sections each with a different radius of curvature, alternative embodiments may have a different number of sections, for example three sections, four sections, five sections, six sections, seven sections, or more than seven sections.

In the edge profile 520 shown in FIG. 9*b*, the radius $r_{2a}$ may be selected from the range of 5-15 mm, for example approximately 10 mm. The radius $r_{2b}$ may be selected from the range of 2 mm-8 mm, for example approximately 5 mm. In an embodiment, $r_{2a} > r_{2b}$, although this is not essential. In an embodiment, at least a part of the edge profile 520 (or 420) may not be curved, i.e. it may have an infinite radius of curvature.

The edge profile 520 of the embodiment shown in FIG. 9*b* extends over a distance labeled $X_2$. The range of values that may be represented by the value $X_2$ shown in FIG. 9*b* may be the same as the range of values for $X_2$ outlined above in relation to the edge profile 420 shown in FIG. 8*b*.

In an embodiment, the distance $X_1$ over which the edge profile in the scanning direction (i.e. in the plane A-A which is perpendicular to the stepping direction) extends is greater than the distance over which the edge profile 420, 520 extends in the stepping direction 120 (i.e. in a cross section through the plane B-B which is perpendicular to the scanning direction 110). In an embodiment, the length $X_1$ is selected from the range of 1.5 to 10 times longer than the distance $X_2$. In an embodiment, the length $X_1$ is selected from the range of 2 to 8 times longer than the distance $X_2$. In an embodiment, the length $X_1$ is selected from the range of 3 to 6 times longer than the distance $X_2$. In an embodiment, the length $X_1$ is selected from the range of 4 to 5 times longer than the distance $X_2$.

Similarly, the length of the edge profile in the scanning direction, shown by reference numerals 410 (in FIG. 8*a*) and 510 (in FIG. 9*a*) may be greater than the length of the edge profile in the stepping direction, shown by reference numerals 420 (in FIG. 8*b*) and 520 (in FIG. 9*b*).

As explained above, the motion, for example velocity and/or acceleration, of the substrate table WT in operation may generally be greater in the scanning direction 110 than in the stepping direction 120. Extending the edge profile 410, 510 over a greater distance in the scanning direction 110 ($X_1$) than the edge profile 420, 520 in the stepping direction 120 ($X_2$) may result in a reduction in the disturbance (such as instabilities and/or waves) produced in the immersion liquid layer 17 in the scanning direction 110. This may be because of, for example, the immersion liquid having a greater distance over which to change direction from substantially horizontal to substantially vertical as it flows over the edge face 407. Additionally or alternatively, extending the edge profile 410, 420, 510, 520 to be greater in the scanning direction 110 than in the stepping direction 120 may result in any disturbance, such as waves, that is formed being diffused, or damped more effectively in the scanning direction 110. This may be appropriate because any waves that are formed in the scanning direction 110 may be stronger, for example of a greater amplitude, than those in the stepping direction 120 because of the greater motion in the scanning direction 110.

The edge profiles 410, 420 of the edge face 407 have been described above in relation to the scanning and stepping directions. In an embodiment, the transition between the edge profile 410 in the scanning direction 110 and the profile 420 in the stepping direction 120 along the edge face 407 may be smooth. This may mean that, for example, there are substantially no discontinuities in any cross sections through the edge face 407. However, this is not necessarily the case. For example, in some embodiments, there may be some discontinuities in the edge face 407.

In an embodiment, such as that shown in FIG. 7, the length of a cross section taken through the edge face 407 may decrease continuously as the plane through which the cross section is taken is rotated from the plane A-A to the plane B-B, for example about an axis of intersection of the two planes A-A and B-B. This axis about which the cross sectional plane is rotated may be an axis that is normal to the flat portion 450 of the substrate table WT and passes through the geometric center of the substrate table WT. The decrease in length from the edge profile through the plane A-A to the edge profile through the plane B-B may be continuous, i.e. there may be no sudden jumps in the length of the cross section. This may further help to prevent and/or reduce the generation of a disturbance (such as waves) in the immersion liquid. Additionally or alternatively, this arrangement may help to suppress, damp or diffuse any disturbance, such as waves, that is produced in the immersion liquid, for example as it flows over the edge face 407.

The precise edge profile 410, 420, 510, 520 of a cross-section taken through the edge face 407 (for example in the plane A-A, the plane B-B, or any plane between A-A and B-B) may be dependent on the expected motion profile (for example speed and/or acceleration) of the substrate table. For example, the edge profile 410, 510 in the cross-section A-A could be chosen based on the expected motion profile in the scanning direction 110. The edge profile 420, 520 in the cross-section B-B could be chosen based on the expected motion profile in the stepping direction 120.

It will be appreciated that any features described herein may be combined with any one or more of the other features. For example, any features of the geometry of the substrate table WT may be combined with one or more other compatible features of the substrate table WT described herein. For example, any of the cross sectional edge profiles (such as those described in relation to FIGS. 8*a*, 8*b*, 9*a* and 9*b*) described herein may be combined with any of the plan view shapes of the substrate table WT described herein (such as those described in relation to FIGS. 7 and 10). Furthermore, an embodiment of the invention may be provided in any suitable manner, for example as a substrate table for an immersion lithographic apparatus, as an immersion lithographic apparatus comprising a substrate table, and/or as a device manufacturing method.

After exposure of the substrate W, the substrate table WT (on which the substrate W may still be supported) may be removed from underneath the projection system. However, immersion liquid may remain on one or more surfaces which have been submersed in immersion liquid during exposure. Such a surface may be part of, for example, a substrate table WT, a substrate W, a sensor 551, 552, 553, 554, and/or a positioning table in which a substrate table WT is mounted. A covering (for example, a cover plate), which is not shown in the Figures, may be provided to one or more of the surfaces listed above that are exposed to immersion liquid. The covering may change a surface property of the surface that was submersed in immersion liquid.

It is desirable to remove immersion liquid (for example an immersion liquid layer) that remains on a surface that has been covered by immersion liquid during exposure of the substrate W after exposure has been completed. In order to remove the immersion liquid from the surface, a drying unit may be provided. Such a drying unit may be a dedicated drying unit.

Figure 11:
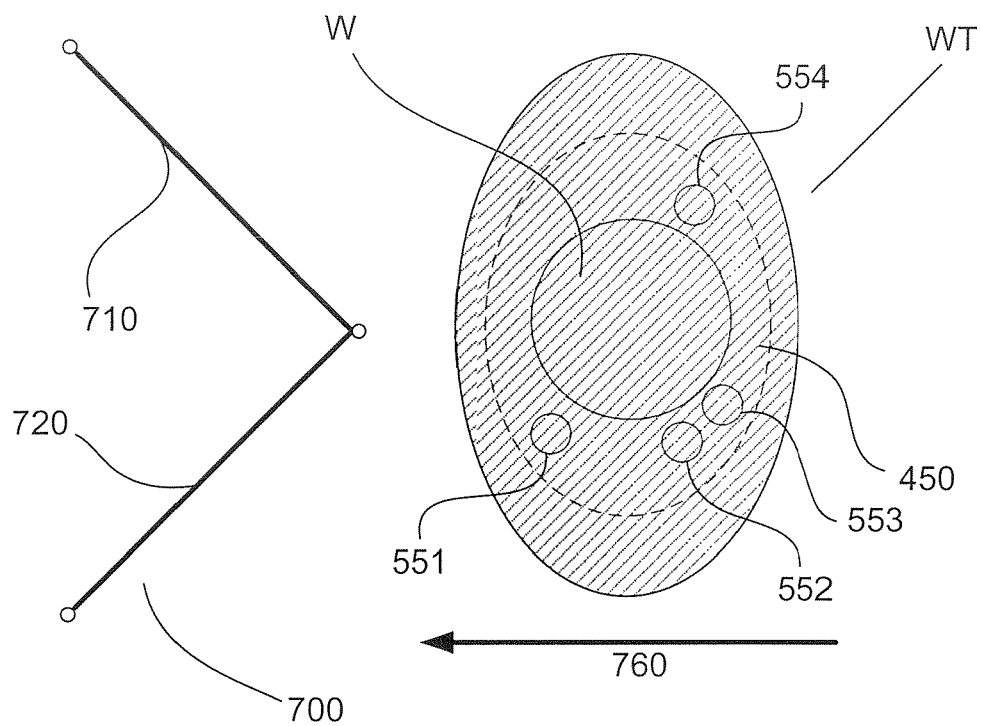
FIG. 11 depicts, in plan, a drying unit for use in removing an immersion liquid layer from a surface of a substrate table.

FIG. 11 shows an example of a drying unit 700 that may be used to remove immersion liquid from a surface of the immersion lithographic apparatus after exposure. The particular example of drying unit 700 shown in FIG. 11 comprises two aims 710, 720. High velocity gas (such as atmospheric air or nitrogen) may be provided along at least a part (for example substantially all) of the length of the arms 710, 720. The high velocity gas may be provided in a direction that is substantially normal to the layer of immersion liquid being removed. Thus, for example, in the example shown in FIG. 11 (and in FIG. 12), the high velocity gas may be provided in a direction that is substantially normal to the page.

Figure 12:
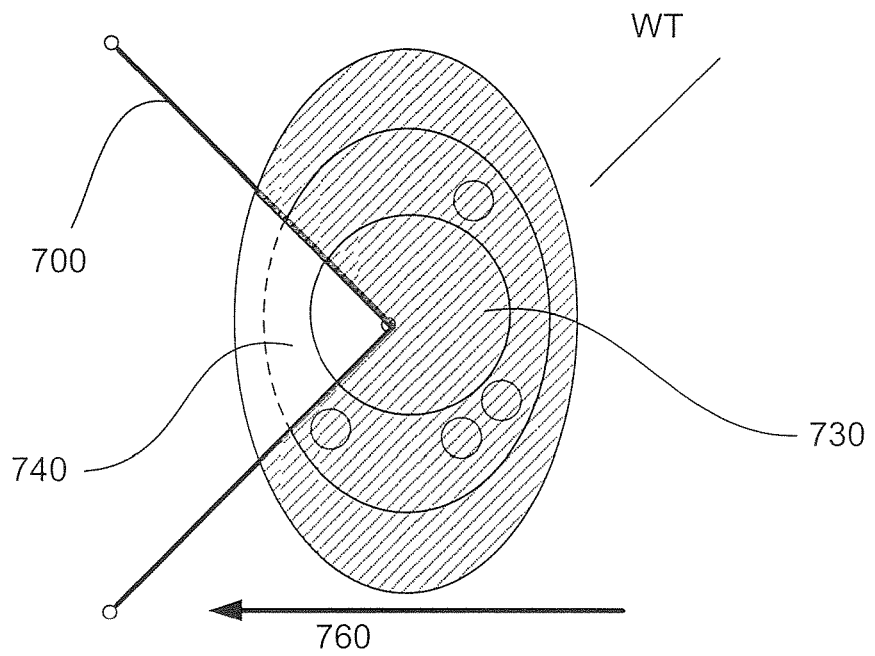
FIG. 12 depicts, in plan, the drying unit of FIG. 11 being used to remove immersion liquid from a substrate table.

In the example shown in FIGS. 11 and 12, there is relative movement between the surface from which the immersion liquid layer is to be removed and the drying unit 700. This may be achieved by moving the drying unit 700, the surface from which the layer of immersion liquid is being removed, or both. In the example shown in FIGS. 11 and 12, the surface from which the layer of immersion liquid is to be removed is moved towards, and underneath, the drying unit 700 in the direction of arrow 760.

The cross-hatched area shown in FIG. 11 shows the region which is covered in a layer of immersion liquid. As can be seen in FIG. 12, once the surface has moved underneath the drying unit 700, a dry region 740 (the area that is not cross-hatched) is produced. The region 730 that is still to pass underneath the drying unit 700 remains covered in immersion liquid (for example a layer of immersion liquid).

In the example shown in FIGS. 11 and 12, the gap (i.e. normal to the page of FIGS. 11 and 12) between the drying unit 700 and the surface being dried may be in the range of from 50 to 500 µm, desirably in the range of from 100 to 200 µm, or desirably approximately 150 µm.

The relative velocity of the surface from which the layer of immersion liquid is moved (e.g., the motion of the substrate table WT in the direction of arrow 760 in FIG. 11) may be in the range of from 0.1 m/s to 2 m/s, desirably in the range of from 0.2 m/s to 1.5 m/s, desirably in the range of from 0.4 m/s to 1 m/s, or desirably around 0.8 m/s.

The apparatus and method described in relation to FIGS. 11 and 12 is an example of a dedicated drying unit. Further or different dedicated drying units could be provided. For example, a drying unit may be provided in which the immersion liquid is removed from the surface by immersion liquid extraction. For example, the immersion liquid may be removed by extraction through a liquid outlet, for example a duct or conduit. Alternative and/or similar drying units are described in United States patent application publication no. US 2008-0007704 and U.S. patent application No. 61/193,576 filed on 8 Dec. 2008, which are both hereby incorporated by reference in their entirety.

However, the methods and apparatuses for removing the layer of immersion liquid from a surface in a single drying step may suffer from drawbacks. For example, in order for the drying unit 700 described in relation to FIGS. 11 and 12 to function effectively, it should provide a large mass flow rate of gas. The mass flow rate of gas should be sufficient to remove substantially all of the immersion liquid from the surface. Any remaining immersion liquid may introduce errors and/or inconsistencies, for example heat absorption as the remaining liquid evaporates, and/or stains being left on the surface from which the remaining immersion liquid evaporates.

Because a large mass flow rate of gas is involved, there is a significant risk of droplets becoming detached from the immersion liquid layer as there is relative movement between the drying unit 700 and the immersion liquid layer. In other words, splashing of the immersion liquid may occur. This may be particularly problematic when the drying unit 700 becomes located over a groove in the surface being dried. Such a groove may be formed by a gap between surfaces. For example, such a groove may be formed by a gap between a surface of the sensors 551, 552, 553, 554 and the substrate table WT. Additionally or alternatively, the large mass flow rate of the drying unit 700 may result in disturbance forces being experienced by the surface being dried, for example because of the momentum of the gas from the drying unit 700 impacting on the surface. Additionally or alternatively, drying of the surface using the drying unit 700 may result in significant heat load being applied to the surface being dried as the liquid is removed.

The alternative drying unit mentioned above in which the immersion liquid is extracted from the surface through a liquid outlet typically requires a high extraction rate in order for the liquid to be removed in a reasonable period of time. This in turn may create significant disturbance forces on the surface being dried. Additionally or alternatively, the drying of the surface may result in significant heat load on the surface during the drying process. Additionally or alternatively, there is a risk that the extraction nozzle (which has to be very close to the substrate) might clamp onto the substrate due to its close proximity. This may create additional disturbances forces and/or inaccuracies.

As will be appreciated, the one or more problems outlined above in relation to the drying of a surface may be exacerbated by the desire to remove a significant volume of immersion liquid from the surface. For example, typically a layer of immersion liquid that is approximately 1 mm thick needs to be removed from the surface. It is therefore desirable to reduce the volume of immersion liquid that is required to be removed from the surface during these drying steps.

In an embodiment, apparatus is configured to perform a pre-drying step before the drying steps described above, for example in relation to FIGS. 11 and 12. Such a pre-drying step is described herein in relation to FIGS. 13 and 14.

It will be noted that the substrate table WT shown in FIGS. 11-14 has the same general form as that described above in relation to FIG. 7. However, it will be appreciated that the apparatus and method relating to removing a layer of immersion liquid from a surface of an immersion lithographic apparatus described in relation to FIGS. 11-14 may apply to any shape of substrate table WT, positioning device to position of the substrate table WT, or indeed any component (or surface thereof) that may be at least partially covered with, or submersed in, immersion liquid, for example during exposure of the substrate W.

Figure 13:
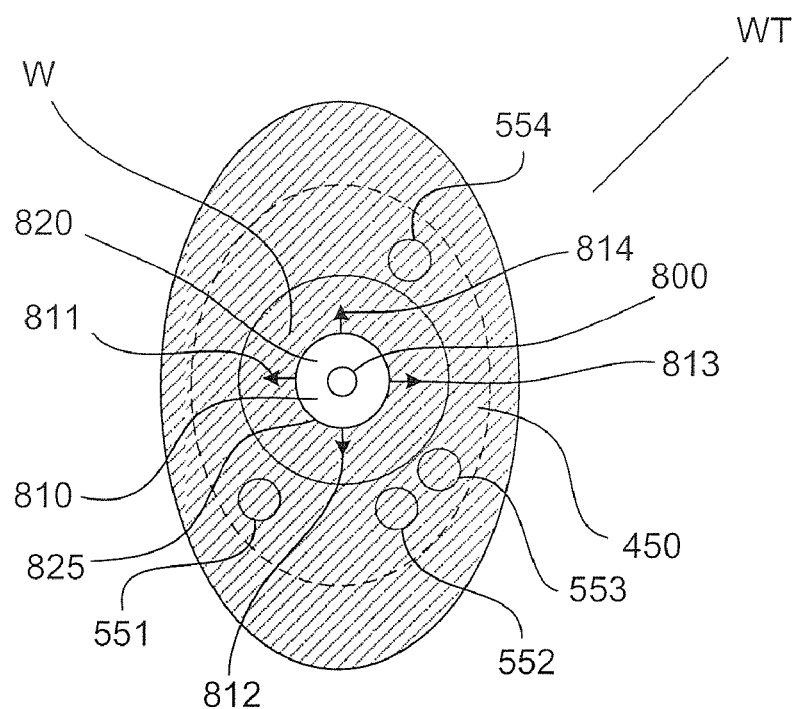
FIG. 13 depicts, in plan, removal of immersion liquid from a surface of an immersion lithographic apparatus according to an embodiment of the invention.

FIG. 13 shows a substrate table WT including various components such as a substrate W, and a sensor 551, 552, 553, 554 that is largely covered in a layer of immersion liquid. The layer of immersion liquid is depicted by the cross-hatched area. FIG. 13 shows an area 810 (in fact the area 810 is part of a surface of the substrate W) from which the immersion liquid layer has been removed. The interface between the dry area 810 and the layer of immersion liquid is shown by the line 825.

The inner circular area 800 of FIG. 13 represents a localized area from which the immersion liquid has been actively removed. Any non-intrusive method may be used to actively remove the immersion liquid from the localized area 800. For example, a non-intrusive method includes a method that may not involve actively contacting the layer of immersion liquid with a physical object.

The localized area from which the immersion liquid has been actively removed may be generated, or initiated, using a trigger. For example, the localized area 800 from which the immersion liquid is actively removed may be produced using a gas jet, the gas jet being a trigger. The gas jet may be a high velocity gas jet or a low velocity gas jet. The gas jet may, for example, be a jet comprising atmospheric air or nitrogen gas. The gas jet may be circular, or substantially circular in cross-section.

Thus, in order to remove the immersion liquid from the surface, the trigger must first of all produce a localized area 800 from which the immersion liquid is actively removed. Furthermore, the localized area must be large enough that the de-wetted area (i.e. the area from which immersion liquid is removed) grows, rather than collapses, when the trigger is removed.

In order for the de-wetted area to grow, rather than collapse, when the trigger is removed, the size of the localized area 800 from which the immersion liquid is actively removed should be larger than a certain size. This size may depend on, for example, the static receding contact angle (SRCA) of the surface on which the immersion liquid layer is formed, and the thickness h of the immersion liquid layer. One relationship (which is given by way of explanation only and is not intended to be limiting) is that the critical dimension d (for example the diameter) of the localized area 800 that is required for the de-wetted area to grow, rather than collapse, may be given by:

$$d = \frac{4h}{\sin(SRCA)}$$

The diameter d of the localized area 800 (which may be approximately equal to the diameter of the gas jet at the point at which it contacts the immersion liquid layer) may be suitable to cause de-wetting to propagate through the immersion liquid for a given thickness of immersion liquid and/or a given static receding contact angle. In an embodiment, the diameter of the gas jet many be in the range of from 0.5 mm to 10 mm, desirably in the range of from 1 mm to 5 mm, or desirably approximately 4 mm. Purely by way of example only, a gas jet suitable to produce a localized area 800 with a diameter of greater than 4 mm (for example a gas jet with a diameter of greater than 4 mm at the point at which it contacts the immersion liquid surface) should be sufficient to cause the de-wetted area to grow, rather than collapse, for an immersion liquid layer of approximately 1 mm with a static receding contact angle of approximately 70°.

A gas jet acting as a trigger should be powerful enough to remove (i.e. de-wet) the immersion liquid from the localized area 800. In this regard, the velocity of the gas jet at the point at which it contacts the immersion liquid surface may be in the range of from 2 ms$^{-1}$ to 35 ms$^{-1}$, desirably in the range of from 3 ms$^{-1}$ to 10 ms$^{-1}$, or desirably around 4 ms$^{-1}$. The effectiveness of the gas jet to de-wet the surface on which the immersion liquid layer is formed in the localized area 800 may be expressed by the Webber Number (We), which is given by:

$$We = \frac{\rho V^2 L}{\sigma}$$

where:
ρ=density of the gas jet fluid
V=velocity of gas jet
L=critical dimension of gas jet, for example diameter
σ=surface tension at the interface between the immersion liquid and the surrounding gas.

The Webber Number may be in the range of from 1 to 10. Typically, the surface tension (σ) may be 72 mN/m, and the density (ρ) may be 1.2 Kg/m$^3$. Thus, purely by way of example only, for a gas jet with a diameter of 4 mm at the point at which it contacts the surface of the immersion liquid, a gas jet velocity of greater than approximately 4 ms$^{-1}$ would give a Webber Number that is approximately 1. Thus, a gas jet with a velocity of greater than approximately 4 ms$^{-1}$ would give a Webber Number of greater than approximately 1.

The velocity of the gas jet at the exit of the gas jet nozzle may be higher than the velocity of the gas jet at the point at which it contacts the immersion liquid surface. This may be because the diameter of the gas jet increases as it moves away from the gas jet nozzle. For example, an empirical relationship between the diameter b of the gas jet at a distance z from the nozzle exit having a nozzle diameter d may be given by:

$$b = d + 0.75 \times z$$

The diameter d of the gas jet nozzle may be, for example, in the range of from 0.5 mm-2 mm, desirably in the range of from 0.75 mm-1.5 mm, or desirably approximately 1 mm. The velocity of the gas at the exit to the nozzle may be, for example, in the range of from 10 ms$^{-1}$ to 70 ms$^{-1}$, desirably in the range of from 20 ms$^{-1}$ to 65 ms$^{-1}$, or approximately 40 ms$^{-1}$. It will be appreciated that velocity of the gas jet at the exit to the nozzle may be greater than 70 ms$^{-1}$ or less than 10 ms$^{-1}$ as required to give the desired gas jet parameters (for example velocity and dimensions) at the point at which it contacts the immersion liquid. Thus, the Mach Number at the gas jet exit may be, for example, in the range of from 0.01 to 0.3, or desirably in the range of from 0.05 to 0.2, although other values (higher or lower) may be possible. Purely by way of example only, for a gas jet velocity of 4 ms$^{-1}$ at the point at which it contacts the immersion liquid surface, a distance between the gas jet nozzle and the surface of the immersion liquid of 3 mm, and a gas jet diameter at the point at which it contacts the immersion liquid surface of approximately 4 mm (i.e. a Webber Number of approximately 1), the velocity of the gas jet at the nozzle exit may be around 20.9 ms$^{-1}$, with an associated Mach Number of approximately 0.06. Typically, the distance between the gas jet nozzle and the surface of the immersion liquid may be, for example, in the range of from 0.5 mm to 5 mm, desirably in the range of from 1 mm to 4 mm, desirably in the range of from 2 mm to 3 mm, or around 2.15 mm, although other distances outside these ranges may be possible.

The gas jet may be provided to the surface of the immersion liquid layer that is to be removed at approximately 90° to that surface.

Any suitable means for providing the gas jet may be used. For example, the gas jet may be produced using a nozzle. High pressure gas may be provided to the nozzle in order to produce the gas jet. Apparatus for producing the gas jet may be provided at any suitable location. For example, the gas jet may be provided along the normal path of the substrate table WT, for example a path which the substrate table WT is arranged to take after the substrate W has been exposed. Thus, the gas jet may be provided from a measurement frame of the immersion lithographic apparatus. Additionally or alternatively, the gas jet may be provided from a position in the immersion lithographic apparatus between the projection system (i.e. the area where the substrate W is exposed) and a drying unit, such as the drying unit 700 described above in relation to FIGS. 11 and 12.

In operation, the gas jet may be provided to the layer of immersion liquid for a short period of time, and then stopped. For example, the gas jet may be provided to the immersion liquid layer for less than 5 seconds, desirably less than 2 seconds, desirably less than 1 second, or desirably less than 0.5 seconds.

Providing the gas jet to the surface of the immersion liquid layer for this discrete period of time results in immersion liquid being actively removed from a localized area so as to produce a dry region in that area. Initially, this dry region is the same size as (or approximately the same size as) the cross-section of the gas jet. In FIG. 13, this initial dry region is shown as region 800.

The active removal of immersion liquid from this localized area results in an interface 825 being formed between the dry region 810 and the immersion liquid layer. This interface 825 propagates outwardly through the immersion liquid layer. This propagation of the interface 825 is depicted in FIG. 13 by arrows 811, 812, 813 and 814. As such, once the initial localized dry area has been generated by the gas jet 800, the immersion liquid layer is then automatically substantially removed from the surface by the propagation of the interface 825. In other words, the propagation of the interface 825 across the surface results in de-wetting.

The rate of propagation of the interface 825 across the surface from which the immersion liquid is being removed may depend on one or more properties of the surface from which the immersion liquid is being removed. For example, the rate of propagation of the interface 825 may increase with increasing lyophobicity (for example increase in hydrophobicity). In this regard, a cover surface, for example a coverplate, may be provided to one or more of the surfaces from which the immersion liquid layer is to be removed. For example, a hydrophobic coverplate may be provided to the upper surface of the substrate table WT.

Additionally or alternatively, the rate of propagation of the interface 825 across the surface from which the immersion liquid is being removed may depend on the thickness of the layer of immersion liquid being removed. For example, the rate of propagation may increase as the thickness of the layer of immersion liquid being removed decreases. The thickness of the layer of immersion liquid may depend on, for example, the flow rate used during exposure and/or the draining time after exposure.

Alternative apparatus and/or method steps may be used to generate the initial localized dry region 800. For example, a radiation beam may be provided to the surface of the immersion liquid layer to generate the initial dry region 800. Such a radiation beam may be a laser beam. In such an embodiment, the laser beam may be referred to as the trigger to generate, or initiate, the initial localized dry region 800.

Such a laser beam (which may be an infrared laser beam) may create a thermocapillary effect. As such, the immersion liquid layer on which it is incident may be locally disturbed. This may cause the liquid layer to spread (and thus thin) at the point of incidence of the laser beam. This spreading may result from localized heating caused by the laser beam. The localized area 800 from which the immersion liquid is actively being removed may thus be induced by a radiation beam by one or both of localized spreading (and thus thinning) of the immersion liquid layer and enhanced evaporation due to localized heating.

The wavelength of the radiation beam (such as laser beam) used in such an embodiment should be of an appropriate wavelength and/or intensity so as not to damage the surface on which the liquid layer is formed (for example, the substrate W, or substrate table WT). Thus, for example, radiation with a sufficiently short absorption length may be used.

In an additional or alternative arrangement, a sound wave (for example a localized sound wave) may be used to generate the localized dry region 800 from which the immersion liquid is actively removed.

In FIG. 13, the initial localized region from which the immersion liquid is removed to produce a dry region is the same, or approximately the same, shape as the trigger that is used to produce it. As discussed above, such a trigger could be, for example, a gas jet or a radiation beam, such as a laser beam, or sound wave. Thus, for example, the localized dry region may initially be a circular region such as that depicted by label 800 in FIG. 13.

Figure 14:
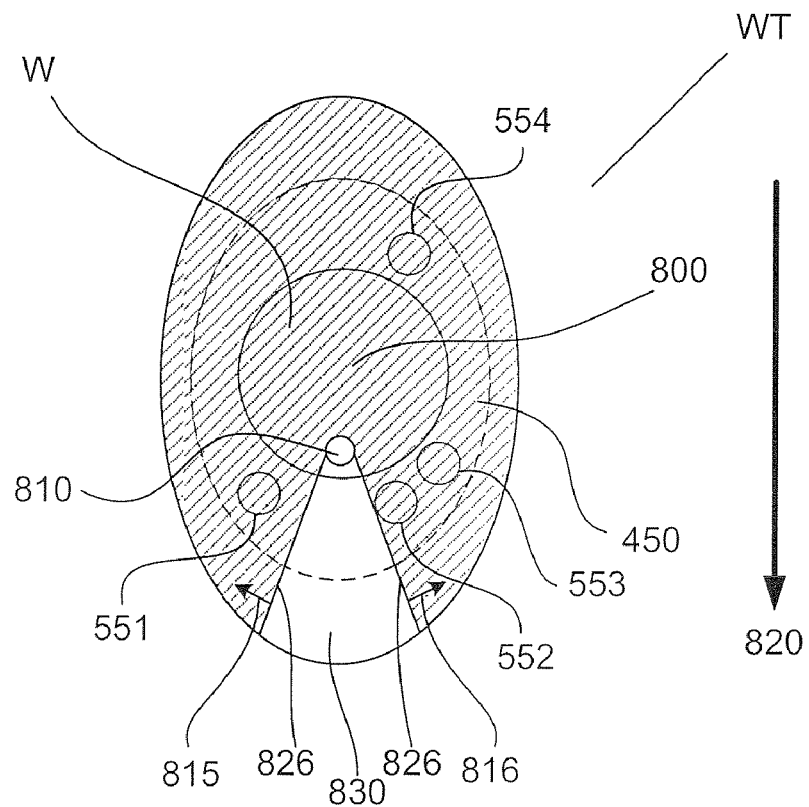
FIG. 14 depicts, in plan, removal of immersion liquid from a surface of an immersion lithographic apparatus in a further embodiment of the invention.

In an embodiment, there may be relative movement between the point of impact of the trigger (for example the gas jet or the radiation beam) used to create the localized dry area 800 in the immersion liquid layer and the immersion liquid layer. An example of such a system is shown in FIG. 14. In FIG. 14, the immersion liquid layer (and the surface on which it is formed) is moved relative to the trigger in the direction of arrow 820. This results in the trigger passing along the immersion liquid layer to form an elongated localized area from which the immersion liquid is actively removed by the trigger. The relative velocity with which the immersion liquid layer and the surface on which it is formed are moved relative to the trigger may be in the range of from 0.1 m/s to 5 m/s, desirably in the range of from 0.2 m/s to 3 m/s, desirably in the range of from 0.5 m/s to 2 m/s, or desirably approximately 1 m/s.

As shown in FIG. 14, when there is relative movement between the point of impact of the trigger and the immersion liquid layer in the manner described above, an interface 826 may be formed between the dry region 830 and the remaining immersion liquid layer. As with the interface 825 shown in FIG. 13, the interface 826 shown in FIG. 14 propagates in a direction that is substantially normal to the interface as shown by arrows 815 and 816. Because immersion liquid is removed from a line in the example in FIG. 14 (due to the relative movement described above), the interface 826 is substantially linear. It may propagate into the immersion liquid so as to form a substantially V-shaped dry region.

Using the method and apparatus described above in relation to FIGS. 13 and 14 can result in most of the immersion liquid layer being removed from the surface before a drying unit such as that shown in FIGS. 11 and 12 may be required. For example, in an embodiment, over 90% of the immersion liquid may be removed from an applicable surface using the technique described above in relation to FIGS. 13 and 14. In an embodiment, approximately 99%, or more, of the immersion liquid layer may be removed from the surface using the technique described above in relation to FIGS. 13 and 14. This means that significantly less immersion liquid needs to be removed using the drying units shown in FIGS. 11 and 12, because of the pre-drying step described herein in relation to FIGS. 13 and 14. Because significantly less immersion liquid needs to be removed by the drying unit 700 shown in FIGS. 11 and 12 (or equivalent dedicated drying unit), many of the problems identified above may be reduced or eliminated. For example, it may be possible to significantly reduce the mass flow rate of gas provided by the drying unit 700, because it would remove a smaller volume of liquid. In an embodiment in which the immersion liquid is extracted through a liquid outlet, it may be possible to significantly reduce the flow rate of the liquid being removed.

According to an embodiment, there is provided a substrate table for an immersion lithographic apparatus having a projection system for projecting a patterned beam of radiation onto a substrate, the projection system having an optical axis, wherein:

the substrate table is configured to support a substrate during exposure and to have an immersion liquid flow off the substrate and over an edge region of the substrate table extending from a substantially flat portion that is perpendicular to the optical axis of the projection system, the edge region having:

a first edge profile in a cross-section taken in a first plane passing through the geometric centre of the substrate table and perpendicular to a first direction in the plane of the substrate, the first edge profile comprising a curve;

a second edge profile, different to the first edge profile, in a cross-section taken in a second plane passing through the geometric centre of the substrate table and perpendicular to a second direction in the plane of the substrate and perpendicular to the first direction, the second edge profile comprising a curve, wherein:

the first edge profile is longer than the second edge profile.

In an embodiment, the first direction is a stepping direction, and the second direction is a scanning direction.

In an embodiment, the edge region has a smooth transition between the first and second edge profiles.

In an embodiment, the edge profile of the edge region in cross section in a plane passing through the intersection of the first and second planes continuously increases in length as the plane is rotated, about the intersection, from the position of the second plane to the position of the first plane.

In an embodiment, the first edge profile is in the range of from 1.5 and 10 times longer than the second edge profile.

In an embodiment, the first edge profile extends in the range of from 30 mm and 50 mm in the second direction.

In an embodiment, the first edge profile is a continuous curve with a radius of curvature that decreases with distance from the substantially flat portion in the second direction.

In an embodiment, the first edge profile comprises a plurality of curve segments, each curve segment having a different radius of curvature.

In an embodiment, each curve segment of the first edge profile has a constant radius of curvature; and the radius of curvature of adjacent curve segments decreases with distance from the substantially flat portion in the second direction.

In an embodiment, the first edge profile comprises:

a first curve segment adjacent the substantially flat portion of the substrate table having a radius of curvature of approximately 25 mm;

a second curve segment adjacent the first curve segment having a radius of curvature of approximately 10 mm; and a third curve segment adjacent the second curve segment having a radius of curvature of approximately 5 mm.

In an embodiment, the second edge profile is a continuous curve with a radius of curvature that decreases with distance from the substantially flat portion in the second direction.

In an embodiment, the second edge profile comprises a plurality of curve segments, each curve segment having a different radius of curvature.

In an embodiment each curve segment of the second edge profile has a constant radius of curvature; and the radius of curvature of adjacent curve segments decreases with distance from the substantially flat portion in the first direction.

In an embodiment the second edge profile comprises:

a first curve segment adjacent the substantially flat portion of the substrate table having a radius of curvature of approximately 10 mm; and a second curve segment adjacent the first curve segment having a radius of curvature of approximately 5 mm.

In an embodiment, in plan view, the perimeter of the substrate table has no discontinuities in radius of curvature.

In an embodiment, the first and second edge profiles are shaped so that immersion liquid supplied to the substrate and/or substrate table flows smoothly over the edge region, the first and second profile shapes being based on the expected acceleration and/or speed of the substrate table in the second and first directions respectively.

According to an embodiment, there is provided a substrate table for an immersion lithographic apparatus, the substrate table configured to support a substrate during exposure and to have an immersion liquid flow off the substrate and over an edge region of the substrate table, wherein, in plan view, the perimeter of the substrate table has no discontinuities in radius of curvature.

In an embodiment, in plan view, the perimeter of the substrate table is longer in the second direction than in the first direction.

In an embodiment, in plan view, the perimeter of the substrate table has a continuously changing radius of curvature.

In an embodiment, in plan view, the perimeter of the substrate table is an elliptical and/or oval shape.

In an embodiment, in plan view, the perimeter if the substrate table has a radius of curvature greater than 30 mm at all points.

In an embodiment, in plan view, the perimeter of the substrate table has a radius of curvature greater than 80 mm at all points.

In an embodiment, in plan view, the perimeter of the substrate table comprises straight portions parallel to the second direction.

In an embodiment, there is provided an immersion lithographic apparatus comprising a substrate table disclosed herein.

In an embodiment, the immersion lithographic apparatus further comprises a projection system for projecting a patterned beam of radiation onto a substrate, the projection system having an optical axis.

In an embodiment, the immersion lithographic apparatus further comprises a fluid handling structure arranged to supply immersion liquid to cover the substrate with immersion liquid, the fluid handling structure comprising a barrier member that has a facing surface that faces the substrate and/or substrate table, wherein in plan view, the perimeter of the substrate table has an instantaneous radius of curvature at all points that is greater than the radius of curvature of the point on the perimeter of the facing surface that is at an equivalent angular position about the optical axis.

According to an embodiment, there is provided a substrate table for an immersion lithographic apparatus, the substrate table comprising:

a substrate support configured to support a substrate, a perimeter of the substrate table being defined in a plane parallel to a surface of the substrate support;

an edge region around at least a part of the perimeter of the table; and a substantially planar portion between the substrate support and the edge region, the edge region having an edge profile in a plane perpendicular to the planar portion and/or substrate support, wherein:

the edge profile continuously changes along the part of the perimeter of the table, the edge profile being configured so that immersion liquid supplied to the substrate and/or substrate table flows smoothly off the substrate table from the substantially planar portion over the edge region.

In an embodiment, at least a part of the perimeter of the table is curved.

In an embodiment, at least a part of the perimeter has a continuously changing radius of curvature.

In an embodiment, at least a part of the edge profile is curved.

In an embodiment, the edge profile has a radius of curvature which increases with displacement away from the perimeter of the table.

In an embodiment, a portion of the edge profile is substantially perpendicular to the substrate support and/or the planar portion.

In an embodiment, at least a part of the edge profile is planar and angled with respect to the planar portion.

According to an embodiment, there is provided a device manufacturing method comprising:

supplying an immersion liquid to a substrate table and/or a substrate held by a substrate table, wherein the substrate table has an edge region that extends from a substantially flat portion that is parallel to the plane of the substrate during exposure, the edge region having:

a first edge profile in a cross-section taken in a first plane passing through the geometric center of the substrate table and perpendicular to a first direction in the plane of the substrate, the first edge profile comprising a curve, and a second edge profile, different to the first edge profile, in a cross-section taken in a second plane passing through the geometric centre of the substrate table and perpendicular to a second direction in the plane of the substrate and perpendicular to the first direction, the second edge profile comprising a curve, wherein the first edge profile is longer than the second edge profile;

allowing the immersion liquid to flow off the substrate and over the edge region of the substrate table; and projecting a patterned beam of radiation through the immersion liquid onto the substrate so as to expose a target portion of the substrate.

According to an embodiment, there is provided a device manufacturing method comprising:

supplying an immersion liquid to a substrate table and/or a substrate held by a substrate table, wherein the substrate table has a perimeter that, in plan view, has no discontinuities in radius of curvature;

allowing the immersion liquid to flow off the substrate and over the edge region of the substrate table; and projecting a patterned beam of radiation through the immersion liquid onto the substrate so as to expose a target portion of the substrate.

According to an embodiment, there is provided a device manufacturing method comprising:

supplying an immersion liquid to a substrate table and/or a substrate held by a substrate table, wherein the substrate table has:

a substrate support configured to support a substrate, a perimeter of the substrate table being defined in a plane parallel to a surface of the substrate support;

an edge region around at least a part of the perimeter of the table; and a substantially planar portion between the substrate support and the edge region, the edge region having an edge profile in a plane perpendicular to the planar portion and/or substrate support, wherein the edge profile continuously changes along the part of the perimeter of the table, the edge profile configured so that immersion liquid supplied to the substrate and/or substrate table flows smoothly off the substrate table from the substantially planar portion over the edge region;

allowing the immersion liquid to flow off the substrate and over the edge region of the substrate table; and projecting a patterned beam of radiation through the immersion liquid onto the substrate so as to expose a target portion of the substrate.

According to an embodiment, there is provided a method of removing immersion liquid from a layer of immersion liquid formed on a surface of an immersion lithographic apparatus, the method comprising:

actively removing immersion liquid from a localized area of the surface so as to produce a dry region that has an interface with the layer of immersion liquid; and allowing the interface to propagate through the layer of immersion liquid such the area of the dry region increases, and the area of the layer of immersion liquid reduces.

In an embodiment, the actively removing immersion liquid from a localized area of the surface comprises providing a gas jet to the surface of the layer of immersion liquid at the location where the dry region is to be formed, the strength of the gas jet being sufficient to produce the dry region.

In an embodiment, the gas jet is circular in cross section, and has a diameter of in the range of from 0.5 mm to 10 mm.

In an embodiment, the gas jet is provided to the surface of the layer of immersion liquid for less than 1 second.

In an embodiment, either atmospheric air or nitrogen is used to produce the gas jet.

In an embodiment, the actively removing immersion liquid from a localized area of the surface comprises providing a radiation beam to the surface of the layer of immersion liquid at the location where the dry region is to be formed, the strength of the radiation being sufficient to produce the dry region.

In an embodiment, the radiation beam is a laser beam.

In an embodiment, the method further providing relative movement between the surface from which the layer of immersion liquid is being removed and the gas jet and/or radiation beam, thereby changing the position on the liquid surface on which the gas jet and/or radiation beam is incident such that the immersion liquid is actively removed from an elongated localized area.

In an embodiment, the velocity of the relative movement is in the range of 0.1 m/s to 5 m/s.

In an embodiment, the method further comprises removing a layer of immersion liquid from a surface of at least one of: a substrate table, a substrate, a sensor, a positioner arranged to move a substrate table relative to a projection system, or a coverplate arranged to cover a surface of a component that is exposed to immersion liquid during exposure.

In an embodiment, the method further comprises drying the surface from which the immersion liquid is being removed, wherein the drying occurs after the actively removing immersion liquid from a localized area and allowing the interface to propagate through the layer of immersion liquid, and the drying is configured to completely remove any remaining immersion liquid from the surface.

According to an embodiment, there is provided a liquid removal apparatus configured to remove liquid from a layer of immersion liquid followed on a surface of an immersion lithographic apparatus, the liquid removal apparatus comprising a trigger device configured to remove immersion liquid from a localized area of the surface so as to produce a dry region that has an interface with the layer of immersion liquid.

In an embodiment, the trigger device comprises a gas supply unit configured to provide a localized gas jet to a surface of the layer of immersion liquid so as to produce the dry region.

In an embodiment, the trigger device comprises a radiation beam generator configured to provide a radiation beam to a surface of the layer of immersion liquid so as to produce the dry region.

In an embodiment, there is provided a drying apparatus configured to dry a surface of an immersion lithographic apparatus, comprising:

the liquid removal apparatus; and a drying unit configured to completely remove any immersion liquid from the surface that remains after operation of the liquid removal apparatus.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described herein may each or in combination be operable when one or more computer programs are read by one or more computer processors located within at least one component of the lithographic apparatus. The controllers may each or in combination have any suitable configuration for receiving, processing, and sending signals. One or more processors are configured to communicate with at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A substrate table for an immersion lithographic apparatus having a projection system to project a patterned beam of radiation onto a substrate, the projection system having an optical axis, wherein the substrate table is configured to support a substrate during exposure and to have an immersion liquid flow off the substrate and over an edge region of the substrate table extending from a substantially flat portion that is substantially perpendicular to the optical axis of the projection system, the edge region having:

a first edge profile in a cross-section taken in a first plane passing through the geometric center of the substrate table and perpendicular to a first direction in the plane of the substrate, the first edge profile comprising a curve; and a second edge profile, different to the first edge profile, in a cross-section taken in a second plane passing through the geometric center of the substrate table and perpendicular to a second direction in the plane of the substrate and parallel to the first direction, the second edge profile comprising a curve, wherein the first edge profile is longer than the second edge profile.

2. The substrate table of claim 1, wherein the first direction is a stepping direction, and the second direction is a scanning direction.

3. The substrate table of claim 1, wherein the edge region has a smooth transition between the first and second edge profiles.

4. The substrate table of claim 1, wherein an edge profile of the edge region in cross section in a plane passing through the intersection of the first and second planes continuously increases in length as the plane is rotated, about the intersection, from the position of the second plane to the position of the first plane.

5. The substrate table of claim 1, wherein the first edge profile is selected from the range of 1.5 and 10 times longer than the second edge profile.

6. The substrate table of claim 1, wherein the first edge profile extends in the range of from 30 mm and 50 mm in the second direction.

7. The substrate table of claim 1, wherein the first edge profile is a continuous curve with a radius of curvature that decreases with distance from the substantially flat portion in the second direction.

8. The substrate table of claim 1, wherein the first edge profile comprises a plurality of curve segments, each curve segment having a different radius of curvature.

9. The substrate table of claim 1, wherein the second edge profile is a continuous curve with a radius of curvature that decreases with distance from the substantially flat portion in the first direction.

10. The substrate table of claim 1, wherein the second edge profile comprises a plurality of curve segments, each curve segment having a different radius of curvature.

11. The substrate table of claim 1, wherein, in plan view, the perimeter of the substrate table has no discontinuities in radius of curvature.

12. The substrate table of claim 1, wherein the first and second edge profiles are shaped so that immersion liquid supplied to the substrate and/or substrate table flows smoothly over the edge region, the first and second profile shapes being based on the expected acceleration and/or speed of the substrate table in the second and first directions respectively.

13. The substrate table of claim 1, wherein, in plan view, the perimeter of the substrate table is longer in the second direction than in the first direction.

14. The substrate table of claim 1, wherein, in plan view, the perimeter of the substrate table has a continuously changing radius of curvature.

15. The substrate table of claim 1, wherein, in plan view, the perimeter of the substrate table has a radius of curvature greater than 30 mm at all points.

16. The substrate table of claim 1, wherein, in plan view, the perimeter of the substrate table has a radius of curvature greater than 80 mm at all points.

17. The substrate table of claim 1, wherein, in plan view, the perimeter of the substrate table comprises straight portions parallel to the second direction.

18. An immersion lithographic apparatus comprising:
a projection system configured to project a patterned beam of radiation onto a substrate, the projection system having an optical axis; and
a substrate table according to claim 1.

19. The immersion lithographic apparatus of claim 18, further comprising:
a fluid handling structure arranged to supply immersion liquid to cover the substrate with immersion liquid, the fluid handling structure comprising a barrier member that has a facing surface that faces the substrate and/or substrate table, wherein in plan view, the perimeter of the substrate table has an instantaneous radius of curvature at all points that is greater than the radius of curvature of the point on the perimeter of the facing surface that is at an equivalent angular position about the optical axis.

20. A device manufacturing method comprising:
supplying an immersion liquid to a substrate table and/or a substrate held by a substrate table, wherein the substrate table has an edge region that extends from a substantially flat portion that is parallel to the plane of the substrate during exposure, the edge region having:
a first edge profile in a cross-section taken in a first plane passing through the geometric center of the substrate table and perpendicular to a first direction in the plane of the substrate, the first edge profile comprising a curve, and
a second edge profile, different to the first edge profile, in a cross-section taken in a second plane passing through the geometric centre of the substrate table and parallel to a second direction in the plane of the substrate and perpendicular to the first direction, the second edge profile comprising a curve,
wherein the first edge profile is longer than the second edge profile;
allowing the immersion liquid to flow off the substrate and over the edge region of the substrate table; and
projecting a patterned beam of radiation through the immersion liquid onto the substrate so as to expose a target portion of the substrate.

21. The method of claim 20, wherein the first direction is a stepping direction, and the second direction is a scanning direction.

22. The method of claim 20, wherein the first edge profile is selected from the range of 1.5 and 10 times longer than the second edge profile.

* * * * *